United States Patent
Kim et al.

(10) Patent No.: US 10,109,900 B2
(45) Date of Patent: Oct. 23, 2018

(54) BATTERY MANAGEMENT APPARATUS AND BATTERY MANAGEMENT METHOD

(71) Applicant: Samsung Electronics Co., Ltd., Suwon-si (KR)

(72) Inventors: Jin Ho Kim, Yongin-si (KR); Ju Wan Lim, Suwon-si (KR); Tae Won Song, Yongin-si (KR); Tae Jung Yeo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 136 days.

(21) Appl. No.: 15/403,864

(22) Filed: Jan. 11, 2017

(65) Prior Publication Data

US 2017/0200994 A1   Jul. 13, 2017

(30) Foreign Application Priority Data

Jan. 12, 2016   (KR) .................. 10-2016-0003852

(51) Int. Cl.
| | |
|---|---|
| *H01M 10/48* | (2006.01) |
| *H01M 10/63* | (2014.01) |
| *G01R 31/36* | (2006.01) |
| *H01M 10/633* | (2014.01) |
| *H01M 10/625* | (2014.01) |
| *H01M 2/10* | (2006.01) |
| *G01R 31/44* | (2006.01) |
| *H02J 7/14* | (2006.01) |

(Continued)

(52) U.S. Cl.
CPC ...... *H01M 10/633* (2015.04); *G01R 31/3606* (2013.01); *G01R 31/3624* (2013.01); *G01R 31/3658* (2013.01); *G01R 31/3679* (2013.01); *G01R 31/44* (2013.01); *H01M 2/1077* (2013.01); *H01M 10/425* (2013.01); *H01M 10/482* (2013.01); *H01M 10/486* (2013.01); *H01M 10/625* (2015.04); *H02J 7/1423* (2013.01); *H02J 7/1453* (2013.01); *H01M 2010/4271* (2013.01); *H01M 2220/20* (2013.01); *H02J 7/0014* (2013.01); *H02J 7/0021* (2013.01)

(58) Field of Classification Search
CPC ............ H01M 10/633; H01M 10/625; H01M 10/482; H01M 10/486; H01M 2/1077; H01M 2010/4271; H01M 2220/20; G01R 31/3624; G01R 31/3658; G01R 31/3679

See application file for complete search history.

(56) References Cited

U.S. PATENT DOCUMENTS

| | | |
|---|---|---|
| 8,838,401 B2 | 9/2014 | Kelly |
| 8,961,004 B2 | 2/2015 | Srinivasan et al. |

(Continued)

FOREIGN PATENT DOCUMENTS

| | | |
|---|---|---|
| JP | 11-162526 A | 6/1999 |
| JP | 2010-243481 A | 10/2010 |

(Continued)

*Primary Examiner* — Renee Luebke
*Assistant Examiner* — Paul Baillargeon
(74) *Attorney, Agent, or Firm* — NSIP Law

(57) ABSTRACT

A battery management apparatus for a battery including battery units, the apparatus including a voltage sensor configured to sense a voltage of each of the battery units; a phase difference calculator configured to calculate a phase difference between the voltage of each of the battery units and a reference voltage; and a temperature controller configured to control a temperature of each of the battery units based on the calculated phase difference.

20 Claims, 8 Drawing Sheets

(51) Int. Cl.
*H01M 10/42* (2006.01)
*H02J 7/00* (2006.01)

(56) References Cited

U.S. PATENT DOCUMENTS

| | | |
|---|---|---|
| 9,229,061 B2 | 1/2016 | Hebiguchi |
| 2012/0155507 A1 | 6/2012 | Srinivasan et al. |
| 2014/0372055 A1 | 12/2014 | Wang et al. |
| 2015/0147608 A1 | 5/2015 | Lin et al. |

FOREIGN PATENT DOCUMENTS

| | | |
|---|---|---|
| JP | 2012-181037 A | 9/2012 |
| JP | 5261622 B1 | 8/2013 |

… # BATTERY MANAGEMENT APPARATUS AND BATTERY MANAGEMENT METHOD

CROSS-REFERENCE TO RELATED APPLICATION(S)

This application claims the benefit under 35 USC 119(a) of Korean Patent Application No. 10-2016-0003852, filed on Jan. 12, 2016, in the Korean Intellectual Property Office, the entire disclosure of which is incorporated herein by reference for all purposes.

BACKGROUND

1. Field

The following description relates to a technique for managing a battery, and more particularly, to a battery management apparatus and a battery management method.

2. Description of Related Art

A secondary battery is formed to have high output power and high capacity to be used as a power source for electric vehicles, hybrid vehicles, etc. A plurality of secondary batteries are connected in series or in parallel to be used as medium and large capacity battery packs. Such a high output power and high capacity battery pack generates a great deal of heat during a charging and discharging process. The heat generated during such processes can make the battery ignite or explode. Further, temperature greatly affects the performance and lifetime of the battery. Therefore, study for a temperature control technique for constantly maintaining a temperature of a battery has been conducted.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

According to a general aspect, a battery management apparatus for a battery including battery units, includes a voltage sensor configured to sense a voltage of each of the battery units;

a phase difference calculator configured to calculate a phase difference between the voltage of each of the battery units and a reference voltage; and a temperature controller configured to control a temperature of each of the battery units on the basis of the calculated phase difference.

The battery may include a battery pack; and the battery unit may include a battery module.

The battery may include a battery module; and the battery unit may include a battery cell.

The battery management apparatus may further include: a reference voltage setter configured to set either one or both of a battery voltage and the voltage of a battery unit of the plurality of battery units as the reference voltage.

The battery management apparatus may further include a reference voltage converter configured to change the set reference voltage.

The reference voltage converter may be further configured to determine whether a reference voltage phase substantially corresponds to a median among voltage phases of the battery units, and in response to the determined result not substantially corresponding to the median, the reference voltage converter being further configured to change the reference voltage to the voltage of a battery unit whose voltage phase is sensed as the median.

The reference voltage converter may be further configured to determine whether a reference voltage phase is closest to a mean of voltage phases of the battery units, and in response to the determined result not being closest to the mean, the reference voltage converter being further configured to change the reference voltage to the voltage of a battery unit whose voltage phase is sensed as being closest to the mean.

The temperature controller may be further configured to decrease the temperature of the battery unit whose voltage is sensed as having an earlier phase than the reference voltage, and increase the temperature of the battery unit whose voltage is sensed as having a later phase than the reference voltage.

The battery management apparatus may further include a temperature estimator configured to either one or both of sense and estimate a reference temperature of a battery unit; a state of charge (SOC) estimator configured to estimate a reference SOC of a battery unit; and a temperature distribution estimator configured to estimate a temperature distribution for each of the battery units on the basis of the calculated phase difference, either one or both of the sensed and estimated reference temperature, and the estimated reference SOC, wherein the reference temperature and the reference SOC are a temperature and an SOC of a battery unit corresponding to the reference voltage.

The temperature distribution estimator may be further configured to estimate the temperature distribution for each of the battery units using a temperature graph based on an SOC and a phase difference between a current and a voltage.

According to another general aspect, a battery management method for a battery including battery units, the method including: sensing a voltage of each of the battery units; calculating a phase difference between the voltage of each of the battery units and a reference voltage; and controlling a temperature of each of the battery units on the basis of the calculated phase difference.

A non-transitory computer-readable storage medium may store instructions that, when executed by a processor, cause the processor to perform the method.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Figure 1:
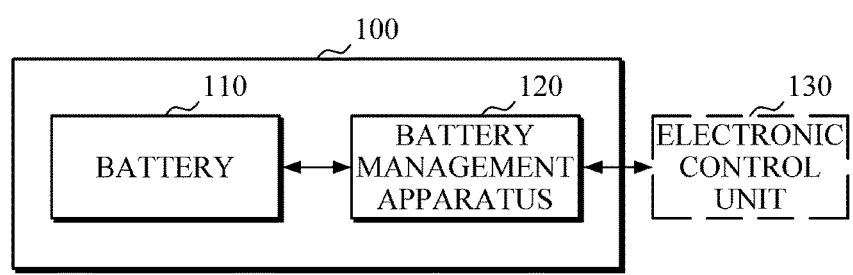
FIG. 1 is a block diagram illustrating an embodiment of a battery system.

FIG. 1 is a block diagram illustrating an embodiment of a battery system.

Referring to FIG. 1, according to an embodiment, a battery system 100 includes a battery 110 and a battery management apparatus 120.

The battery 110 supplies power to an apparatus in which the battery system 100 is mounted. Here, the battery 110 includes a plurality of battery units connected in some combination of series and/or in parallel. According to an embodiment, the battery 110 is a battery module including a plurality of battery cells, or a battery pack including a plurality of battery modules. A battery unit, as used herein, is a constituent unit for forming the battery 110, the battery unit may be a battery cell when the battery 110 includes a battery module made up of battery cells, and the battery unit may be a battery module when the battery 110 includes a battery pack made up of battery modules. Each battery unit may be a secondary battery such as a nickel metal battery, a lithium ion battery, lithium polymer, etc. Further, the capacity of each battery unit may be the same as or different from each other.

The battery management apparatus 120 monitors a state of the battery 110 (made up of battery cells and/or battery modules) and may manage the battery according to the monitoring result.

The battery management apparatus 120 estimates operational characteristics of the battery 110 such as, for example: a state of charge (SOC) and a state of health (SOH) on the basis of data derived from parametric measurements (for example, a temperature or a temperature change rate of the battery 100, a voltage, a voltage change rate, and a current or current draw change rate of each battery unit, etc.) sensed from the battery 110. Here, the SOC may refer to information with respect to an amount of charge stored in the battery 110 such as, for example Amp Hours (AH), and the SOH may refer to information with respect to the performance of the battery 110 which is degraded in comparison to when the battery 110 was manufactured. The SOH may be represented in, for example, cycles exhausted, cycles remaining, capacity fade (CF), load deviation (LD), or other suitable parameters.

According to an embodiment, the battery management apparatus 120 estimates the SOC of the battery 110 using a Coulomb counting method, an equivalent circuit model method, an electrochemical model method, a data-based method, or other suitable measures. However, the above-described methods are merely one non-limiting embodiment, and the battery management apparatus 120 may estimate the SOC of the battery 110 using various methods as would be understood by one of skill in the art after gaining a thorough understanding of the subject application.

According to an embodiment, the battery management apparatus 120 estimates the SOH of the battery 120 using an open circuit voltage (OCV) method which estimates an SOH by sensing an open voltage of the battery 110, an electrochemical impedance spectroscopy (EIS) method which estimates an SOH by sensing an internal resistance of the battery 110, etc. However, the above-described methods are merely non-limiting examples and the battery management apparatus 120 may estimate the SOH of the battery 110 using various methods.

The battery management apparatus 120 estimates an internal temperature distribution of the battery 110, that is, a temperature distribution for each battery unit, on the basis of a sensed voltage of each battery unit, and performs a temperature control of the battery 110. Further, the battery management apparatus 120 prevents overcharging and over-discharging of the battery 110, and controls the battery 110 so that SOCs between the plurality of battery modules (or cells) included in the battery are substantially equal by performing cell balancing. Accordingly, energy efficiency of the battery is significantly increased, and a lifetime of the battery is extended.

The battery management apparatus 120, according to one or more embodiments, provides either one or both of the SOC and/or the SOH of the battery 110 for an electronic control unit (ECU) 130. At this point, the battery management apparatus 120 communicates with the ECU 130 using controller area network (CAN) communication or other suitable communication measures.

Figure 2:
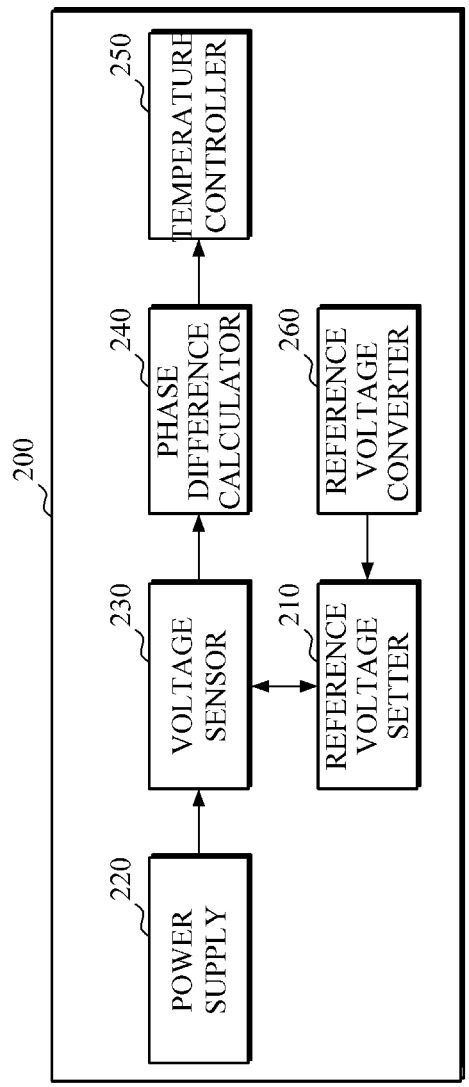
FIG. 2 is a block diagram illustrating an embodiment of a battery management apparatus.

FIG. 2 is a block diagram illustrating an embodiment of a battery management apparatus 200 which may be an implementation of battery management apparatus 120. Here, a battery includes a plurality of battery units. The battery may be a battery module including a plurality of battery cells, or a battery pack including a plurality of battery modules. As the battery unit is a unit for forming the battery, the battery unit may be a battery cell when the battery includes a battery module, and the battery unit may be a battery module when the battery includes a battery pack.

A battery management apparatus 200 shown in FIG. 2 is an embodiment of the battery management apparatus 120 shown in FIG. 1.

Referring to FIG. 2, the battery management apparatus 200 includes a reference voltage setter 210, a power supply 220, a voltage sensor 230, a phase difference calculator 240, a temperature controller 250, and a reference voltage converter 260.

The reference voltage setter 210 sets a reference voltage. According to an embodiment, the reference voltage setter 210 sets a battery voltage or the voltage of a battery unit (i.e. a battery cell or a battery module) among the plurality of battery units as the reference voltage. That is, the reference voltage setter 310 sets the reference voltage to have a voltage value of one or more (such as by averaging, or other measures) of the battery units The power supply 220 applies a predetermined power to the battery. Here, the power may be alternating current (AC) power (an AC voltage source or AC current source) or direct current (DC) power (a DC voltage source or DC current source).

The voltage sensor 230 senses the reference voltage and a voltage of each of the battery units.

The phase difference calculator 240 calculates a phase difference between the voltage of each of the battery units and the reference voltage.

According to an embodiment, the phase difference calculator 240 calculates the phase difference between the voltage of each of the battery units and the reference voltage using a Fourier transform, a Hilbert transform method, or other suitable measures as will be known to one of skill in the art after gaining a thorough understanding of the disclosure.

According to another embodiment, the phase difference calculator 240 senses a phase difference between a current and a voltage of each of the battery units using a phase meter and a phase difference between a current corresponding to the reference voltage and the reference voltage, and calculates a phase difference between the voltage of each of the battery units and the reference voltage using a difference between the above two phase differences.

However, according to one or more embodiments, the phase difference calculator 240 may calculate the phase difference between the voltage of each of the battery units and the reference voltage using various methods.

The temperature controller 250 controls a temperature of each of the battery units on the basis of the phase difference between the voltage of each of the battery units and the reference voltage.

A temperature of the battery (or the battery unit) is expressed as a function of an SOC of the battery (or the battery unit) and a phase difference between a current flowing in the battery (or the battery unit) and a voltage loaded in the battery (or the battery unit). When a phase of a current flowing in the battery and a phase of a current flowing in each of the battery units are the same, a temperature distribution of each of the battery units is in proportion to a phase difference distribution between the voltage of each of the battery units and the reference voltage. Therefore, a temperature of a battery unit whose voltage is sensed as having an earlier phase than the reference voltage is higher than a temperature of a reference unit, and a temperature of a battery unit whose voltage is sensed as having a later phase than the reference voltage is lower than the temperature of the reference unit.

According to an embodiment, in consideration of the above characteristics, the temperature controller 250 controls to decrease the temperature of the battery unit whose voltage is sensed as having an earlier phase than the reference voltage, and to increase the temperature of the battery unit whose voltage is sensed as having a later phase than the reference voltage. The temperature controller 250, according to one or more embodiments, decreases or increases the temperature of a battery unit by any one or any combination of two or more of: adjusting a phase difference between a voltage and a current; reducing a charging or a draw current; selectively reconfiguring an interconnection between battery units; adjusting a coolant fluid flow rate; or other suitable measures.

The reference voltage converter 260, according to an embodiment, changes the reference voltage according to a predetermined reference when a voltage of one battery unit of the plurality of battery units is set as the reference voltage.

According to an embodiment, when a voltage of one battery unit of the plurality of battery units is set as the reference voltage, the reference voltage converter 260 determines whether a reference voltage phase corresponds to a median among voltage phases of the plurality of battery units, and when the determined result dose not substantially correspond to the median, the reference voltage converter 260 changes the reference voltage to a voltage of the battery unit whose voltage phase is sensed as being the median. For example, a battery includes three battery units and a voltage of a first battery unit is initially set as the reference voltage. The result of sensing a voltage of each of the battery units shows that a voltage phase of the first battery unit is $\pi/8$, a voltage phase of a second battery unit is $-\pi/2$, and a voltage phase of a third battery unit is 0, and when the battery units are arranged in order of earliest phase, a battery unit phase $\pi/8$, a battery unit phase 0, and a battery unit phase $-\pi/2$ are sequentially arranged. Because the battery unit having a voltage phase of a median is the third battery unit (phase 0), the reference voltage converter 260 changes the reference voltage from the voltage of the first battery unit to a voltage of the third battery unit.

According to another embodiment, when a voltage of one battery unit of the plurality of battery units is set as the reference voltage, the reference voltage converter 260 determines whether a reference voltage phase is closest to a mean of voltage phases of the plurality of battery units among the voltage phases of the plurality of battery units, and when the determined result is not closest to the mean, the reference voltage converter 260 changes the reference voltage to the voltage of the battery unit whose voltage phase is sensed as closest to the mean. In the above-described example, because a mean of the voltage phases of three battery unit is $-\pi/8$, the reference voltage converter 260 changes the reference voltage from the voltage of the first battery unit to the voltage of the third battery unit whose voltage phase is sensed as being closest to the mean.

When the reference voltage is changed, the phase difference calculator 240 calculates a phase difference between a voltage of each of the battery units and the changed reference voltage.

Figure 3:
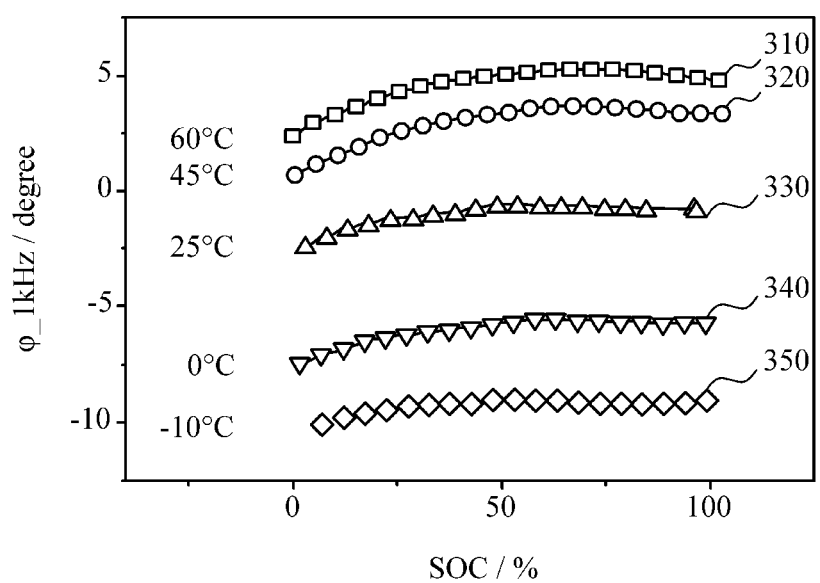
FIG. 3 is a graph of an example describing relationship among a state of charge (SOC) of a battery, a phase difference between a current and a voltage, and temperature.

FIG. 3 is a graph of an example describing a relationship among an SOC of a battery, a phase difference between a current and a voltage, and temperature. As FIG. 3 is showing a case in which AC power of 1 kHz is applied, a vertical axis of a graph refers to a phase difference between a current and a voltage of the battery, and a horizontal axis of the graph denotes the SOC of the battery. Further, reference numeral 310 denotes a case in which a temperature of the battery is 60° C., reference numeral 320 denotes a case in which the temperature of the battery is 45° C., reference numeral 330 denotes a case in which the temperature of the battery is 25° C., reference numeral 340 denotes a case in which the temperature of the battery is 0° C., and reference numeral 350 denotes a case in which the temperature of the battery is −10° C.

As shown in FIG. 3, the temperature of the battery may be expressed as a function of the SOC and the phase difference between a current and a voltage (hereinafter, a temperature estimating equation). The temperature estimating equation is an equation which defines a relationship among a phase difference between a current flowing in a battery and a voltage loaded in the battery, an SOC of the battery, and a temperature of the battery when AC power having a predetermined frequency is applied, and may be experimentally derived in advance. For example, the temperature estimating equation may be derived in advance by applying AC power having the predetermined frequency to the battery under conditions of various temperatures and various SOCs of the battery and sensing a phase difference between a current flowing in the battery and a voltage loaded in the battery according to the temperatures and the SOCs of the battery to obtain a relationship among an internal temperature of the battery, the SOC of the battery, and the phase difference.

Figure 4A:
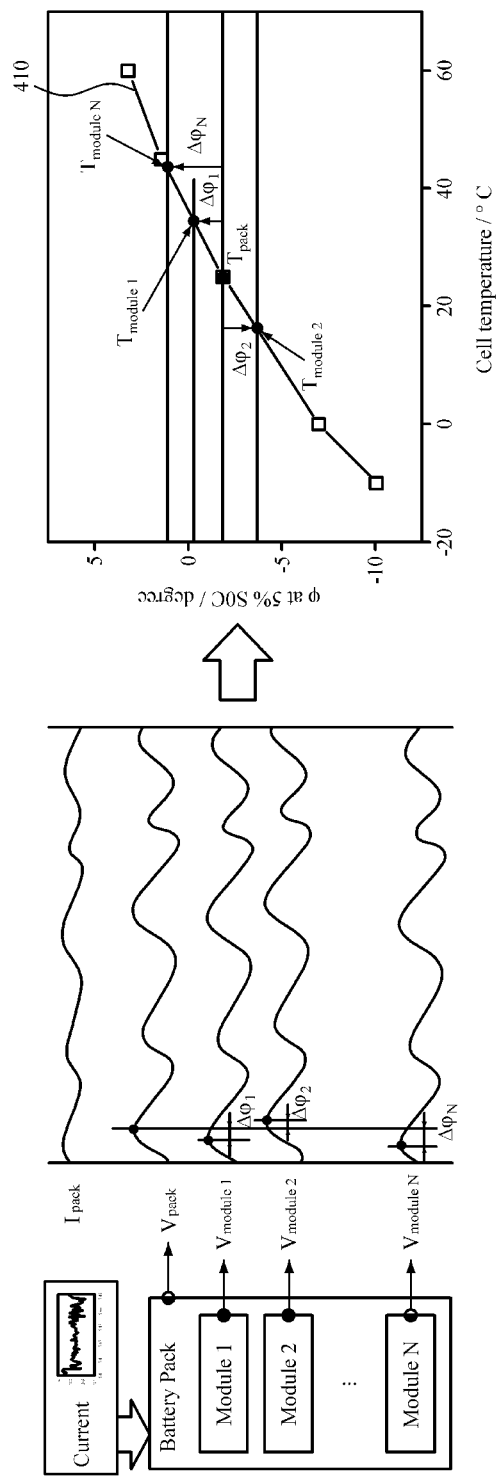
FIG. 4A is a view describing a process of temperature control for each battery unit when a reference voltage is set to a battery voltage according to an embodiment.

FIG. 4A is a view describing a process of a temperature control for each battery unit when a reference voltage is set to a battery voltage. Here, when reference numeral 410 denotes that an SOC of a battery is 5%, a temperature graph based on a phase difference between a current and a voltage is shown. The temperature graph is derived, for example, on the basis of the temperature estimating equation. Further, it is assumed that the battery is a battery pack and a battery unit is a battery module.

Referring to FIGS. 2 and 4A, the power supply 220 applies power to the battery pack.

The voltage sensor 230 senses a voltage $V_{pack}$ of the battery pack and voltages $V_{module1}$ to $V_{moduleN}$ of the battery modules. At this point, currents flowing in the battery pack and each of the battery modules are substantially the same as a current $I_{pack}$.

The phase difference calculator 240 calculates phase differences $\Delta\varphi_1$ to $\Delta\varphi_N$ between each of the voltages $V_{module1}$ to $V_{moduleN}$ of battery modules Module 1 to Module N and the voltage $V_{pack}$ of the battery pack.

The temperature controller 250 controls a temperature of each battery unit on the basis of the phase differences $\Delta\varphi_1$ to $\Delta\varphi_N$ calculated by the phase difference calculator 240.

Referring to a temperature graph 410, when a temperature of the battery pack is $T_{pack}$, temperatures $T_{module1}$ and $T_{moduleN}$ of a first battery module Module 1 and an $N^{th}$ battery module Module N which have an earlier voltage phase than the battery pack voltage $V_{pack}$ are higher than the temperature $T_{pack}$ of the battery pack, and a temperature $T_{module2}$ of a second battery module Module 2 having a later voltage phase than the battery pack voltage $V_{pack}$ is lower than the temperature $T_{pack}$ of the battery pack.

In the case of an example shown in the drawing, the temperature controller 250 decreases the temperatures of the first battery module, Module 1, and the $N^{th}$ battery module, Module N, which have the earlier voltage phase than the battery pack voltage $V_{pack}$ and increases the temperature of the second battery module, Module 2, having the later voltage phase than the battery pack voltage.

Figure 4B:
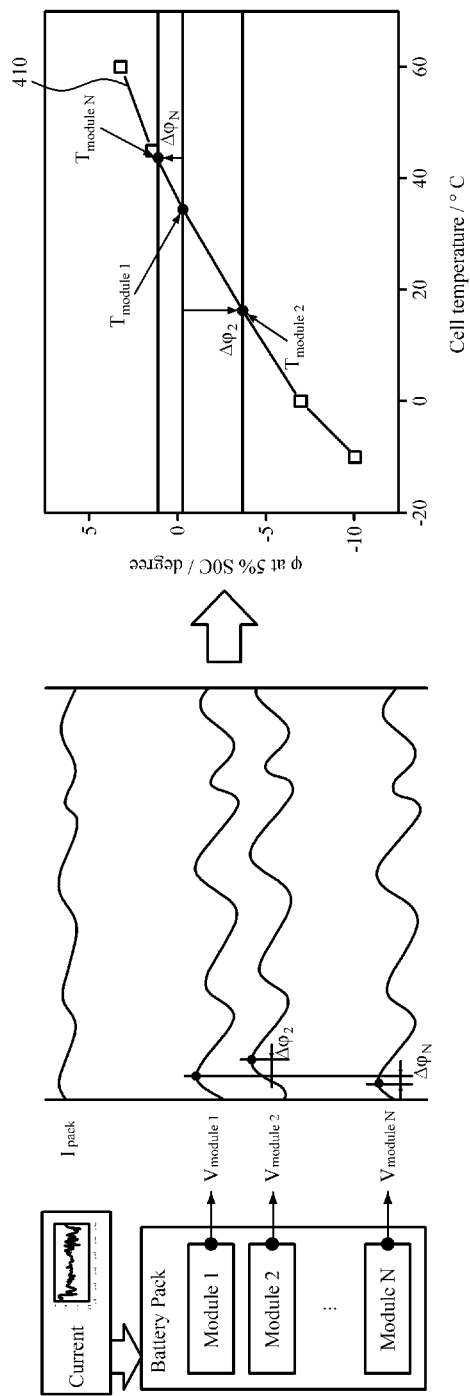
FIG. 4B is a view describing a process of a temperature control for each battery unit when a reference voltage is set to a battery unit voltage according to an embodiment.

FIG. 4B is a view describing a process of a temperature control for each battery unit when a reference voltage is set to a battery unit voltage. Here, reference numeral 410 denotes a temperature graph based on a phase difference between a current and voltage when an SOC of the battery is 5%. The temperature graph is derived on the basis of the temperature estimating equation. Further, it is assumed that the battery is a battery pack, a battery unit is a battery module, and a reference voltage is set to a voltage of a first battery module, Module 1.

Referring to FIGS. 2 and 4B, the power supply 220 applies power to the battery pack.

The voltage sensor 230 senses voltages $V_{module1}$ to $V_{moduleN}$ of battery modules. At this point, currents flowing in the battery pack and each of the battery modules are substantially the same as a current $I_{pack}$.

The phase difference calculator 240 calculates phase differences $\Delta\varphi_2$ and $\Delta\varphi_N$ between the voltage $V_{module1}$ of the first battery module, Module 1, and each of the voltages $V_{module1}$ and $V_{moduleN}$ of the battery modules Module 2 and Module N.

The temperature controller 250 controls a temperature of each battery unit on the basis of the phase differences $\Delta\varphi_2$ and $\Delta\varphi_N$ calculated by the phase difference calculator 240.

Referring to the temperature graph 410, when a temperature of the first battery module, Module 1, is $T_{module1}$, a temperature $T_{moduleN}$ of the $N^{th}$ battery module, Module N, having an earlier voltage phase than the first battery module voltage $V_{module1}$ is higher than the temperature $T_{module1}$ of the first battery module, Module 1, and a temperature $T_{module2}$ of the second battery module, Module 2, having a later voltage phase than the first battery module voltage $V_{module1}$ is lower than the temperature $T_{module1}$ of the first battery module, Module 1.

In the case of an example shown in the drawing, the temperature controller 250 decreases the temperature of the $N^{th}$ battery module, Module N, having the earlier voltage phase than the first battery module voltage $V_{module1}$ and increases the temperature of the second battery module, Module 2, having the later voltage phase than the first battery module voltage $V_{module1}$.

Figure 5:
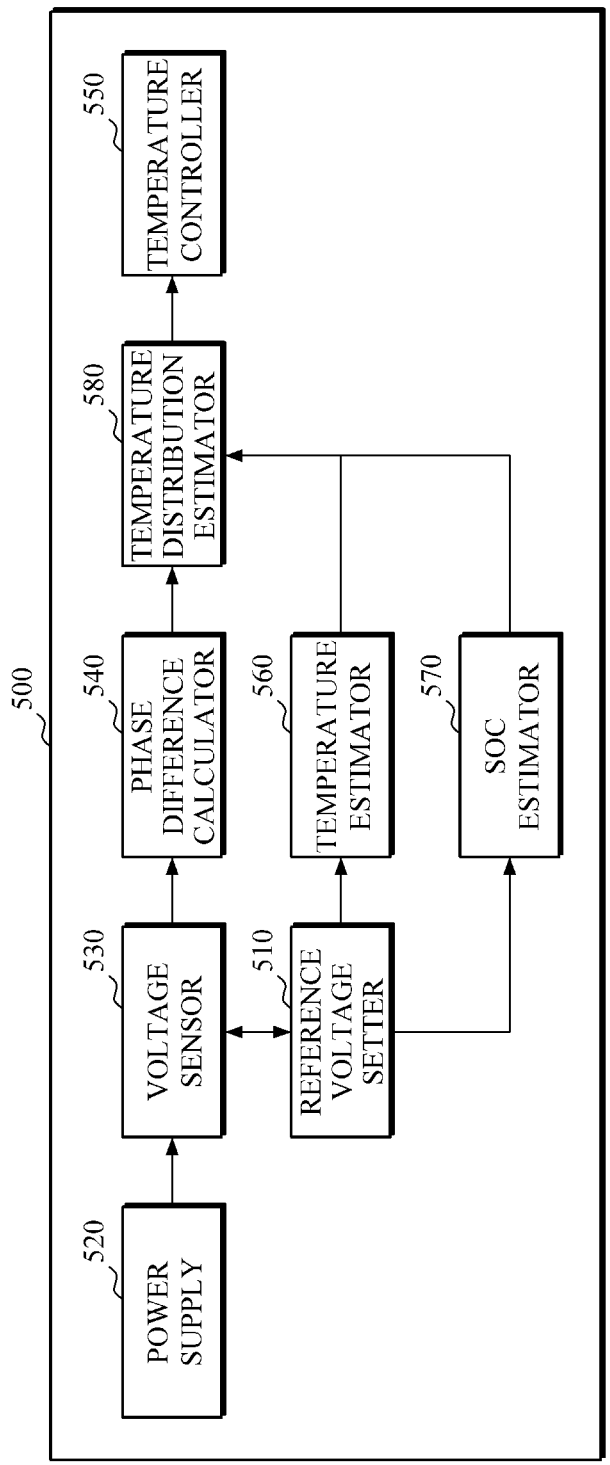
FIG. 5 is a block diagram illustrating an embodiment of a battery management apparatus.

FIG. 5 is a block diagram illustrating another embodiment of a battery management apparatus.

Referring to FIG. 5, a battery management apparatus 500 includes a reference voltage setter 510, a power supply 520, a voltage sensor 530, a phase difference calculator 540, a temperature controller 550, a temperature estimator 560, an SOC estimator 570, and a temperature distribution estimator 580.

Because the reference voltage setter 510, the power supply 520, the voltage sensor 530, the phase difference calculator 540, and the temperature controller 550 are the same as (or similar to) the reference voltage setter 210, the power supply 220, the voltage sensor 230, the phase difference calculator 240, and the temperature controller 250 shown in FIG. 2, the detailed descriptions thereof will be omitted for clarity and conciseness.

The temperature estimator 560 senses or estimates a reference temperature. Here, the reference temperature refers to a temperature of a subject sensed as having a reference voltage (for example, a battery when the reference voltage is a battery voltage, and a battery unit when the reference voltage is the battery unit) (hereinafter, a reference voltage sensing subject).

For example, the temperature estimator 560 estimates the reference temperature on the basis of a temperature of coolant flowing around the battery. For another example, the temperature estimator 560 senses the reference temperature using a temperature sensor installed at the reference voltage sensing subject. For still another example, the temperature estimator 560 estimates the reference temperature through a temperature estimating equation. Here, the temperature estimating equation may be experimentally derived in advance using an equation which defines a relationship among a phase difference between a current and a voltage of a battery, an SOC of the battery, and a temperature of the battery as described with reference to e.g. FIG. 3. However, the above-described methods are merely an illustrative, non-limiting embodiment, the present invention is not limited thereto, and the temperature estimator 660 may sense or estimate the reference temperature using various methods as would be known to one of skill in the art after gaining a thorough understanding of the disclosure.

The SOC estimator 570 estimates a reference SOC. The reference SOC refers, for example, to an SOC of the reference voltage sensing subject.

For example, the SOC estimator 570 estimates the reference SOC through a Coulomb counting method, an equivalent circuit model method, an electrochemical model method, a data-based method, etc. However, the above-described methods are merely an embodiment, the present invention is not limited thereto, and the SOC estimator 570 may estimate the reference SOC using various methods.

The temperature distribution estimator 580 estimates a temperature distribution for each battery unit on the basis of the reference temperature, the reference SOC, and a voltage phase difference between the reference voltage and each of the battery units. According to an embodiment, the temperature distribution estimator 580 estimates the temperature distribution for each of the battery units using a temperature graph based on an SOC and a phase difference between a current and a voltage. Because the temperature graph based on an SOC and a phase difference between a current and a voltage was described with reference to FIG. 4, the detailed description thereof will be omitted for clarity and conciseness.

Meanwhile, the temperature controller 550 controls a temperature of each of the battery units on the basis of the estimated temperature distribution for each of the battery units. For example, the temperature controller 550 decreases the temperature of a battery unit whose temperature is greater than, equal to, or approaches a predetermined critical temperature and, conversely, increases the temperature of a battery unit whose temperature is less than the set critical temperature on the basis of the temperature distribution for each of the battery units.

Figure 6:
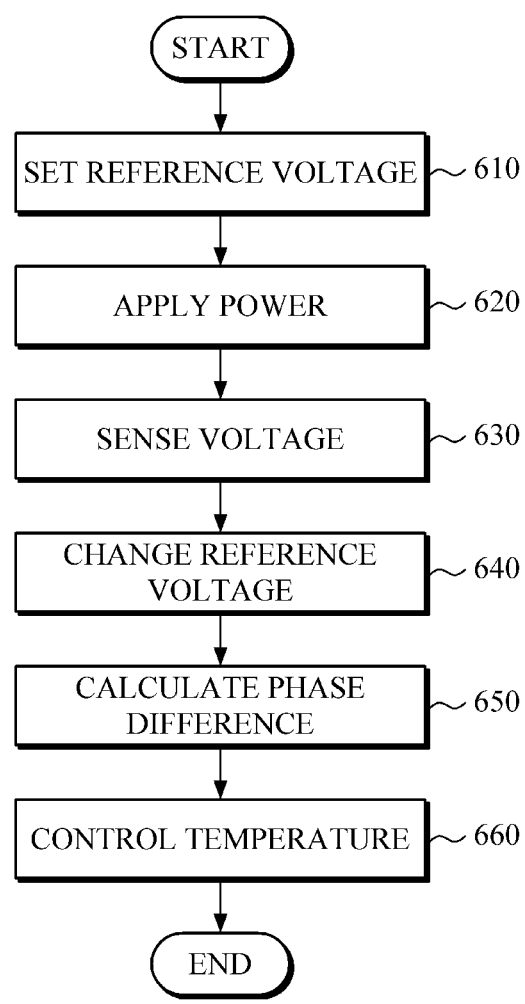
FIG. 6 is a flowchart illustrating an embodiment of a battery management method.

FIG. 6 is a flowchart illustrating an embodiment of a battery management method. Here, a battery may include a plurality of battery units. The battery may be a battery pack including a plurality of battery modules, or a battery module including a plurality of battery cells. As the battery unit is a unit for forming the battery, the battery unit may be a battery module when the battery includes a battery pack, and the battery unit may be a battery cell when the battery includes a battery module.

Referring to FIGS. 2 and 6, the battery management apparatus 200 sets a reference voltage (610). According to an embodiment, the battery management apparatus 200 sets a battery voltage or a voltage of one battery unit among the plurality of battery units as the reference voltage.

The battery management apparatus 200 applies a predetermined power to the battery (620). Here, the power may be AC power (an AC voltage source or AC current source) or DC power (a DC voltage source or DC current source).

The battery management apparatus 200 senses a voltage of each battery unit and the reference voltage (630).

The battery management apparatus 200 changes the reference voltage set in operation 610 (640). For example, when the voltage of one battery unit of the plurality of battery units is set as the reference voltage, the battery management apparatus 200 determines whether a reference voltage phase corresponds to a median among voltage phases of the plurality of battery units, and when the determined result does not correspond to the median, the battery management apparatus 200 changes the reference voltage to the voltage of the battery unit whose voltage phase is sensed as the median amongst the batteries. For another example, when the voltage of one battery unit of the plurality of battery units is set as the reference voltage, the battery management apparatus 200 determines whether a reference voltage phase is closest to a mean of voltage phases of the plurality of battery units, when the determined result is not closest to the mean, the battery management apparatus 200 changes the reference voltage to the voltage of a battery unit whose voltage phase is sensed as being closest to the mean.

The battery management apparatus 200 calculates a phase difference between a voltage of each of the battery units and the reference voltage (650).

For example, the battery management apparatus 200 calculates the phase difference between the voltage of each of the battery units and the reference voltage using a Fourier transform or Hilbert transform method. For another example, the battery management apparatus 200 senses a phase difference between a current and a voltage for each of the battery units and a reference voltage corresponding to the phase difference between the current and the reference voltage using a phase meter, and calculates a phase difference between the voltage of each of the battery units and the reference voltage using a difference between the above two phase differences. However, the above-described embodiment is not limited thereto, and the battery management apparatus 200 may calculate the phase difference between the voltage of each of the battery units and the reference voltage using various methods.

The battery management apparatus 200 controls a temperature of each of the battery units on the basis of the phase difference between the voltage of each of the battery units and the reference voltage (660).

A temperature of the battery (or the battery unit) is expressed as a function of an SOC of the battery (or the battery unit) and a phase difference between a current flowing in the battery (or the battery unit) and a voltage loaded in the battery (or the battery unit). When a phase of the current flowing in the battery and a phase of a current flowing in each of the battery units are the same, a temperature distribution of each of the battery units is proportionate to a phase difference distribution between the voltage of each of the battery units and the reference voltage. Therefore, a temperature of a battery unit whose voltage is sensed as having an earlier phase than the reference voltage is higher than a temperature of a reference unit, and a temperature of a battery unit whose voltage is sensed as having a later phase than the reference voltage is lower than the temperature of the reference unit.

According to an embodiment, in consideration of the above characteristics, the battery management apparatus 200 controls to decrease the temperature of the battery unit whose voltage is sensed as having an earlier phase than the reference voltage, and to increase the temperature of the battery unit whose voltage is sensed as having a later phase than the reference voltage.

Figure 7:
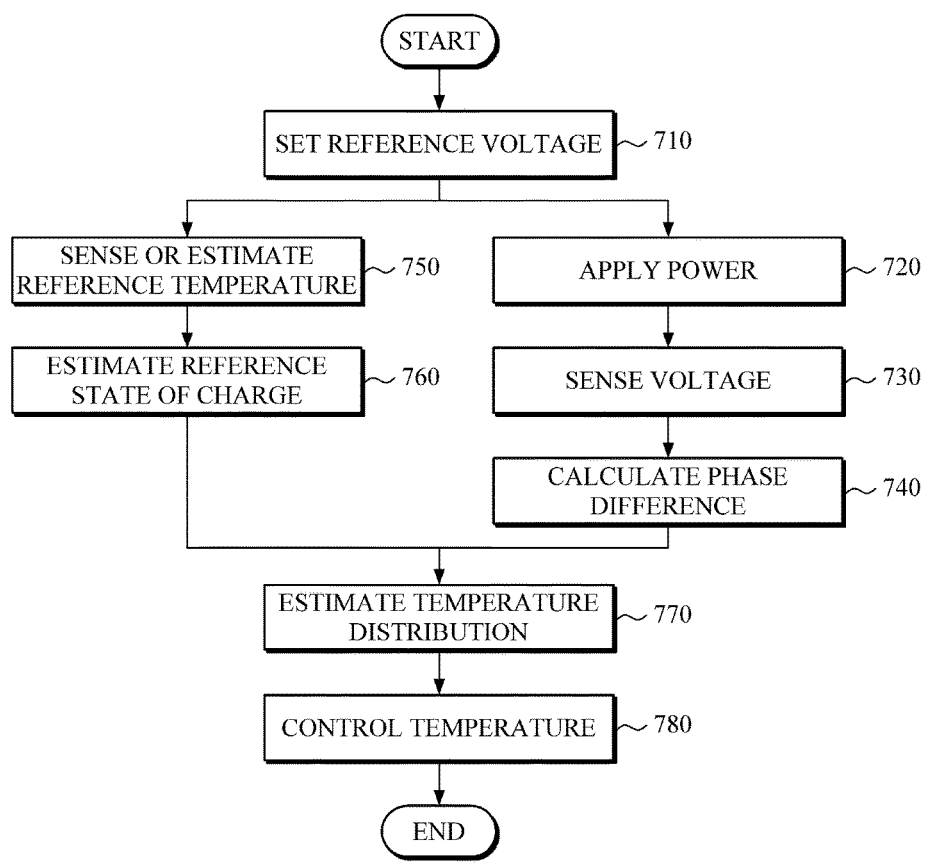
FIG. 7 is a flowchart illustrating an embodiment of a battery management method.

FIG. 7 is a flowchart illustrating another embodiment of a battery management method.

Referring to FIGS. 5 and 7, the battery management apparatus 500 sets a reference voltage (710). According to an embodiment, the battery management apparatus 500 sets a battery voltage or the voltage of one battery unit among the plurality of battery units as the reference voltage.

The battery management apparatus 500 applies a predetermined power to the battery (720). Here, the power may be AC power (an AC voltage source or AC current source) or DC power (a DC voltage source or DC current source).

The battery management apparatus 500 senses a voltage of each battery unit and the reference voltage (730).

The battery management apparatus 500 calculates a phase difference between the voltage of each of the battery units and the reference voltage (740).

The battery management apparatus 500 senses or estimates a reference temperature (750). The reference temperature refers to a temperature of a reference voltage sensing subject. For example, the battery management apparatus 500 estimates the reference temperature on the basis of a temperature of coolant flowing around the battery. For another example, the battery management apparatus 500 senses the reference temperature using a temperature sensor installed at the reference voltage sensing subject. For still another example, the battery management apparatus 500 estimates the reference temperature through a temperature estimating equation. The temperature estimating equation may be experimentally derived in advance using an equation which defines a relationship among a phase difference between a current and a voltage of a battery, an SOC of the battery, and a temperature of the battery as described, for example, with reference to FIG. 3.

The battery management apparatus 500 estimates a reference SOC (760). The reference SOC refers to an SOC of the reference voltage sensing subject. For example, the battery management apparatus 500 estimates the reference SOC using one or a combination of one or more of: a Coulomb counting method, an equivalent circuit model method, an electrochemical model method, and/or a data-based method, etc.

The battery management apparatus 500 estimates a temperature distribution for each of the battery units on the basis of one or a combination of one or more of: the reference temperature, the reference SOC, and a voltage phase difference between the reference voltage and each of the battery units (770). According to an embodiment, the battery management apparatus 500 estimates the temperature distribution for each of the battery units using a temperature graph or relationship equation based on an SOC and a phase difference between a current and a voltage. Because the temperature graph based on an SOC and a phase difference between a current and a voltage was described with reference to FIG. 4, the detailed description thereof will be omitted for clarity and conciseness.

The battery management apparatus 500 controls a temperature of each of the battery units on the basis of the estimated temperature distribution for each of the battery units (780). For example, the battery management apparatus 500 decreases the temperature of a battery unit whose temperature is greater than a predetermined critical temperature and increases the temperature of a battery unit whose temperature is less than the predetermined critical temperature on the basis of the temperature distribution for each of the battery units.

The electronic controller 130, reference voltage setter 210, phase difference calculator 240, temperature controller 250, temperature estimator 560, SOC estimator 570, temperature distribution estimator 580, in FIGS. 1, 2, and 5 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 4A, 4B, 6, and 7 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery management apparatus for a battery comprising battery units, the apparatus comprising:
    a voltage sensor configured to sense a voltage of each of the battery units;
    a phase difference calculator configured to calculate a phase difference between the voltage of each of the battery units and a reference voltage; and
    a temperature controller configured to control a temperature of each of the battery units based on the calculated phase difference.

2. The battery management apparatus of claim 1, wherein:
    the battery comprises a battery pack; and
    the battery unit comprises a battery module.

3. The battery management apparatus of claim 1, wherein:
    the battery comprises a battery module; and
    the battery unit comprises a battery cell.

4. The battery management apparatus of claim 1, further comprising:
    a reference voltage setter configured to set either one or both of a battery voltage or the voltage of a battery unit of the battery units as the reference voltage.

5. The battery management apparatus of claim 4, further comprising:
    a reference voltage converter configured to change the set reference voltage.

6. The battery management apparatus of claim 5, wherein the reference voltage converter is further configured to determine whether a reference voltage phase substantially corresponds to a median among voltage phases of the battery units, and in response to the determined result not substantially corresponding to the median, the reference voltage converter being further configured to change the reference voltage to the voltage of a battery unit with a voltage phase sensed as the median.

7. The battery management apparatus of claim 5, wherein the reference voltage converter is further configured to determine whether a reference voltage phase is closest to a mean of voltage phases of the battery units, and in response to the determined result not being closest to the mean, the reference voltage converter being further configured to change the reference voltage to the voltage of a battery unit with a voltage phase is sensed as being closest to the mean.

8. The battery management apparatus of claim 1, wherein the temperature controller is further configured to decrease the temperature of the battery unit with a voltage sensed as having an earlier phase than the reference voltage, and increase the temperature of the battery unit with a voltage sensed as having a later phase than the reference voltage.

9. The battery management apparatus of claim 1, further comprising:
    a temperature estimator configured to either one or both of sense and estimate a reference temperature of a battery unit;
    a state of charge (SOC) estimator configured to estimate a reference SOC of a battery unit; and
    a temperature distribution estimator configured to estimate a temperature distribution for each of the battery units based on the calculated phase difference, either one or both of the sensed and estimated reference temperature, and the estimated reference SOC,
    wherein the reference temperature and the reference SOC are a temperature and an SOC of a battery unit corresponding to the reference voltage.

10. The battery management apparatus of claim 9, wherein the temperature distribution estimator is further configured to estimate the temperature distribution for each of the battery units using a temperature graph based on an SOC and a phase difference between a current and a voltage.

11. A battery management method for a battery comprising battery units, the method comprising:

sensing a voltage of each of the battery units;
calculating a phase difference between the voltage of each of the battery units and a reference voltage; and
controlling a temperature of each of the battery units based on the calculated phase difference.

12. The battery management method of claim 11, wherein:
the battery comprises a battery pack; and
the battery unit comprises a battery module.

13. The battery management method of claim 11, wherein:
the battery comprises a battery module; and
the battery unit comprises a battery cell.

14. The battery management method of claim 11, further comprising:
setting either one or both of a battery voltage or the voltage of a battery unit among the battery units as the reference voltage.

15. The battery management method of claim 14, further comprising:
changing the set reference voltage.

16. The battery management method of claim 15, wherein the changing of the reference voltage comprises:
determining whether a reference voltage phase substantially corresponds to a median among voltage phases of the battery units, and in response to the determined result not substantially corresponding to the median, changing the reference voltage to a voltage of a battery unit with a voltage phase sensed as the median.

17. The battery management method of claim 15, wherein the changing of the reference voltage comprises:
determining whether a reference voltage phase is closest to a mean of voltage phases of the battery units and in response to the determined result not being closest to the mean changing the reference voltage to a voltage of a battery unit with a voltage phase sensed as being closest to the mean.

18. The battery management method of claim 11, wherein the controlling of the temperature of each of the battery units comprises decreasing the temperature of the battery unit with a voltage sensed as having an earlier phase than the reference voltage, and increasing the temperature of the battery unit with a voltage sensed as having a later phase than the reference voltage.

19. The battery management method of claim 11, further comprising:
either one or both of sensing and estimating a reference temperature of a battery unit;
estimating a reference state of charge (SOC) of a battery unit; and
estimating a temperature distribution for each of the battery units based on the calculated phase difference, either one or both of the sensed and estimated reference temperature, and the estimated reference SOC.

20. The battery management method of claim 19, wherein the estimating of the temperature distribution for each of the battery units comprises estimating a temperature distribution for each of the battery units using a temperature graph based on an SOC and a phase difference between a current and a voltage.

* * * * *